(12) United States Patent
Venkatasubramanian

(10) Patent No.: US 6,505,468 B2
(45) Date of Patent: Jan. 14, 2003

(54) CASCADE CRYOGENIC THERMOELECTRIC COOLER FOR CRYOGENIC AND ROOM TEMPERATURE APPLICATIONS

(75) Inventor: Rama Venkatasubramanian, Cary, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 0 days.

(21) Appl. No.: 09/812,811

(22) Filed: Mar. 21, 2001

(65) Prior Publication Data

US 2001/0052234 A1 Dec. 20, 2001

Related U.S. Application Data

(60) Provisional application No. 60/190,924, filed on Mar. 21, 2000.

(51) Int. Cl.[7] ............................................... F25B 21/02
(52) U.S. Cl. ............................................. 62/3.2; 62/331
(58) Field of Search .......................... 62/3.2, 331, 114, 62/160; 136/201, 205

(56) References Cited

U.S. PATENT DOCUMENTS

| | | | |
|---|---|---|---|
| 5,436,467 A | * | 7/1995 | Elsner et al. ............... 62/3.2 X |
| 5,550,387 A | * | 8/1996 | Elsner et al. ............... 62/3.2 X |
| 6,222,113 B1 | * | 4/2001 | Ghoshal ....................... 136/201 |
| 6,300,150 B1 | * | 10/2001 | Venkatasubramanian | |

* cited by examiner

*Primary Examiner*—Chen-Wen Jiang
(74) *Attorney, Agent, or Firm*—Oblon, Spivak, McClelland, Maier & Neustadt, P.C.

(57) ABSTRACT

A cascade thermoelectric cooler designed to cool to cryogenic temperatures of 30 to 120 K integrates high performance\high-ZT $Bi_xSb_{2-x}Te_3$ and $Bi_2Te_{3-x}Se_3$-based super-lattice-structure thin-film thermoelectric devices with a bulk-material based thermoelectric cooler including plural cascaded cold stages with each successive cascaded cold stage able to cool to a progressively lower temperature. Each cold stage in the bulk-material thermoelectric cooler includes a heat source plate, a heat sink plate, a p-type thermoelectric, and a n-type thermoelectric. Moreover, the thin-film thermoelectric cooler can have multiple stages in which each stage contains a heat source plate, a heat sink plate, a p-type super-latticed thermoelectric element, and a n type super-latticed thermoelectric element. By bonding an output heat source plate on the thin-film thermoelectric cooler to an input heat sink plate on the bulk-material thermoelectric cooler, the integration of the thin-film thermoelectric with the bulk-material-based thermoelectric yields a cascade thermoelectric cooler wherein the bulk-material-based thermoelectric cooler cools to 160 K and the thin-film thermoelectric device cools to cryogenic temperatures between 70 and 120 K. Another level of thin-film super-lattice integration can achieve temperatures of 30 K. Alternatively, the integration of a high ZT thin-film super-lattice thermoelectric cooler on a multi-staged bulk-material-based thermoelectric cooler can produce a higher performance non-cryogenic cooler.

45 Claims, 7 Drawing Sheets

CASCADE CRYOGENIC THERMOELECTRIC COOLER FOR CRYOGENIC AND ROOM TEMPERATURE APPLICATIONS

CROSS REFERENCE TO RELATED DOCUMENTS

This application claims benefit of priority to U.S. Provisional Application No. 60/190,924 filed in the United States Patent and Trademark Office on Mar. 21, 2000, the entire disclosure of which is incorporated herein by reference. This application is related to U.S. Ser. No. 09/381,963, "Thin Film Thermoelectric Device and Fabrication Method of Same", filed Sep. 30, 1999 and recently allowed, the entire disclosure of which is incorporated herein by reference. This application is also related to U.S. Provisional Application No. 60/253,743, "Spontaneous Emission Enhanced Heat Transport Method and Structures for Cooling, Sensing, and Power Generation", filed Nov. 29, 2000, the entire disclosure of which is incorporated herein by reference.

BACKGROUND OF THE INVENTION

1. Field of the Invention

This invention relates to a cascade cryogenic thermoelectric cooler and a method of manufacturing the same. The cascade cryogenic thermoelectric cooler integrates high coefficient of performance thin-film super-lattice devices with cascaded bulk-material-based thermoelectric devices to enable cooling to cryogenic temperatures such as 30–120 K.

2. Discussion of the Background

Solid-state thermoelectric cooling to cryogenic temperatures between 70 and 120 K will improve the performance of electronics and sensors such as for example RF receiver front-ends, infrared (IR) imagers, ultra-sensitive magnetic signature sensors, and superconducting electronics based on high-$T_c$ (100 to 120 K) superconducting materials.

Today, bulk thermoelectric materials based on p-$Bi_xSb_{2-x}Te_3$ and n-$Bi_2Te_{3-x}Se_x$ do not have a sufficient figure-of-merit (ZT) or a coefficient of performance (COP) to achieve cryogenic temperatures. For example, a commercial 6-stage Melcor thermoelectric cooler (Melcor, Trenton, N.J.) with a COP of about 0.028 can only approach a cold-side temperature of about 167 K for a hot-side temperature of 300 K. Similarly a 6-stage Marlow thermoelectric cooler (Marlow Industries, Dallas, Tex.) can approach a temperature of about 165 K with a COP of 0.026.

The principle reason that thermoelectric devices with a hot-side of 300 K based on bulk p-$Bi_{2-x}Sb_xTe_3$ and bulk n-$Bi_2Te_{3-y}Se_y$ can not approach cryogenic temperatures is that the ZT values of bulk materials drop as the temperature lowers. The figure of merit drops at lower temperatures because of a higher thermal conductivity as well as a lower Seebeck coefficient.

One bulk-material which does not have low ZT values at lower temperature is BiSb A BiSb device could be stacked on top of a cooler made from bulk p-$Bi_{2-x}Sb_xTe_3$ and bulk n-$Bi_2Te_{3-y}Se_y$. However, for BiSb to offers a reasonable ZT, in order to achieve cryogenic temperatures, a magnetic field must also be used; this is not practical in most applications. Furthermore, both n- and p-type conducting BiSb materials are not achievable.

In essence, there are no set of known bulk thermoelectric materials (certainly not devices) that have sufficient ZT (and COP in devices) between 85 and 300 K to achieve cryogenic refrigeration.

In contrast to bulk materials, the thermal conductivity of superlattice structures decreases at lower temperatures. A variety of processes in superlattice structures such as for example mini-band conduction, lack of alloy scattering, and interface-carrier-scattering apparently better preserve reasonable Seebeck coefficients at lower temperatures. Thus, superlattice materials are expected to have at lower temperatures higher ZT values than bulk-materials, and devices made from superlattice materials are expected to have higher COP. Despite the higher ZT of superlattice thin-film materials, thin film cryogenic thermoelectric coolers are not available. Integration of a large number of superlattice thin-film device stages necessary to achieve the temperature difference between room and cryogenic temperatures presents complications which are beyond the maturity of superlattice thermoelectric devices, presently limited by thermal mismatch and temperature gradient issues and also practically limited by the high cost of thin-film superlattice materials.

Thus, an all-thermoelectric cryogenic cooler, implying the advantages of solid-state reliability and without additional mechanical/or other forms of cooling, is not available.

SUMMARY OF THE INVENTION

Accordingly, one object of the present invention is to provide a cascade cryogenic thermoelectric cooler integrating a bulk-material based thermoelectric cooler with a super-latticed thermoelectric cooler. The bulk-material based thermoelectric cooler is configured with a cascade of multiple stages with each stage configured to cool to progressively lower temperatures, and the super-latticed thermoelectric cooler is interfaced to the bulk material device thermoelectric cooler.

Another object of the present invention is to provide a cascade cryogenic thermoelectric cooler which can approach a cold side temperature of 85 K.

Still another object of the present invention is to interface a super-lattice thin film thermoelectric cooler with a bulk-material-based thermoelectric cooler such that the bulk-material-based thermoelectric cooler reduces the hot-side temperature of the super-lattice thin film thermoelectric cooler to significantly below 300 K, for example between 170–200 K, wherein super-lattice materials relying on the thermal conductivity reduction due to phonon scattering at the super-lattice interfaces will be more efficient.

A further object of the present invention is to reduce the thermal mismatch and temperature gradients imposed on a cascade of super-lattice thin-film coolers.

Another object of the present invention is to provide a thermoelectric cooler wherein the potentially expensive super-lattice technology is utilized only for achieving cryogenic or near-cryogenic temperatures and thus provides a cost-effective cryogenic cooler.

Still another object of the present invention is to provide an integrated thermoelectric cooler in which high performance/high ZT superlattice structure thin-film thermoelectric devices could be used to more efficiently cool than a thermoelectric cooler using only bulk-materials.

These and other objects are achieved according to the present invention by providing a novel cascade thermoelectric cooler designed to cool to cryogenic temperatures of 30 to 120 K. The cascade thermoelectric cooler integrates high performance\high-ZT $Bi_xSb_{2-x}Te_3$ and $Bi_2Te_{3-x}Se_x$-based super-lattice-structure thin-film thermoelectric devices with a bulk-material based thermoelectric cooler including plural cascaded cold stages with each successive cascaded cold stage able to cool to a progressively lower temperature. Each cold stage in the bulk-material thermoelectric cooler includes a heat source plate, a heat sink plate, p-type thermoelectric elements, and n-type thermoelectric elements. Moreover, the thin film thermoelectric cooler can have multiple stages which each stage contains a heat source plate, a heat sink plate, p-type super-latticed thermoelectric elements, and n type super-latticed thermoelectric elements. By attaching an output heat source plate on the thin-film thermoelectric cooler to an input heat sink plate on the bulk-material thermoelectric cooler, the integration of the thin film thermoelectric with the bulk-material-based thermoelectric yields a cascade thermoelectric cooler wherein the bulk-material-based thermoelectric cooler cools to 170–200 K and the thin-film thermoelectric device cools to cryogenic temperatures between 70 and 120 K. Another level of thin-film super-lattice integration can achieve temperatures near 30 K.

According to one aspect of the present invention, the cascade thermoelectric cooler is utilized to cool superconducting coils in electric motors or generators. The cascade cooler is either integrated directly in contact with the superconducting coils or mounted to a sub-77 K transfer coupling in thermal contact with the superconducting coils. The cascade cooler either cools through multiple stages from near room temperature to cryogenic temperatures or cools from liquid nitrogen temperatures (i.e. 77 K) to cryogenic temperatures.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DESCRIPTION OF THE PREFERRED EMBODIMENTS

Figure 1:
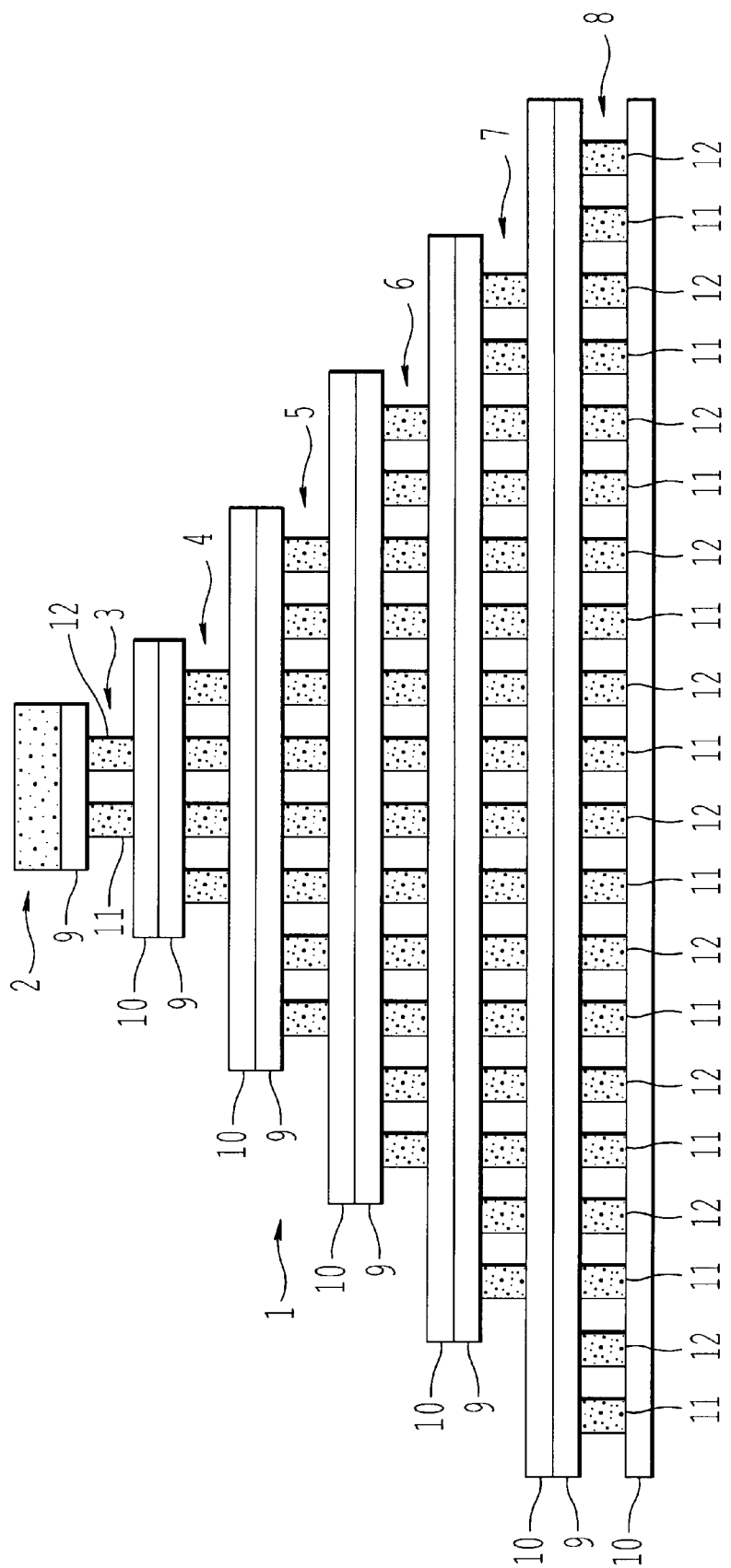
FIG. 1 is schematic of a thin-film thermoelectric cooler using superlattice films cascaded on to a conventional bulk thermoelectric cooler.

Referring now to the drawings, wherein like reference numerals designate identical or corresponding parts throughout the several views, and more particularly to FIG. 1 thereof, there is shown a schematic of a thin-film thermoelectric cooler using superlattice films cascaded onto a conventional bulk thermoelectric cooler. Thus, the cooler according to the present invention integrates a super-lattice-structure thin film thermoelectric device with a conventional multi-staged bulk-material-based thermoelectric cooler having a progressively higher number bulk-material-based thermoelectric devices.

While the present invention is not limited to any particular design of the bulk or thin-film thermoelectric coolers, either in the type of materials used or specific device design, FIG. 1 illustrates the basic structure of the cascade cooler which has a multi-staged bulk-material based thermoelectric cooler 1 onto which a thin-film thermoelectric cooler 2 is interfaced. FIG. 1 shows that each stage 3, 4, 5, 6, 7, 8 of the bulk-material-based thermoelectric cooler includes a heat source plate 9, a heat sink plate 10 operating at an elevated temperature with respect to the heat sink plate, at least one pair of a n-type bulk-material thermoelectric element 11 and a p-type bulk-material thermoelectric element 12 connected electrically in series and disposed between the heat source and sink plates with each pair of bulk-material thermoelectric elements electrically connected in series. Each stage from ambient temperature results in a progressively lower temperature until near cryogenic temperatures are reached.

Thus in one preferred embodiment, the cascade thermoelectric cooler of the present invention utilizes a bulk-material-based thermoelectric cooler having multiple cold stages with each hotter stage having a progressively higher number of bulk-material-based thermoelectric devices to compensate for internal heat generation within the individual thermoelectric devices.

In another preferred embodiment, the cascade thermoelectric cooler of the present invention utilizes in each cold stage of the bulk-material-based thermoelectric cooler p-type $Bi_xSb_{2-x}Te_3$, and n-type $Bi_2Te_{3-x}Se_3$ thermoelectric elements. Other bulk materials such as $CdBi_4Te_6$ could be used for the low temperature stages within the bulk-material-based cooler.

In a still another preferred embodiment, the cascade thermoelectric cooler of the present invention integrates a high-performance/high-ZT $Bi_2Te_3$-based superlattice structured thin-film thermoelectric cooler onto a conventional bulk-material-based thermoelectric cooler. This integration provides high ZT materials in the cold stages of the cascade thermoelectric cooler. ZT values for superlattice materials at low temperatures (200 K to 77 K) are likely to be between 1–2. In contrast, bulk materials have ZT in the range of 0.5 or less. Consequently, superlattice material devices are expected to offer a significantly larger COP compared to current state-of-the-art bulk material devices.

Figure 2:
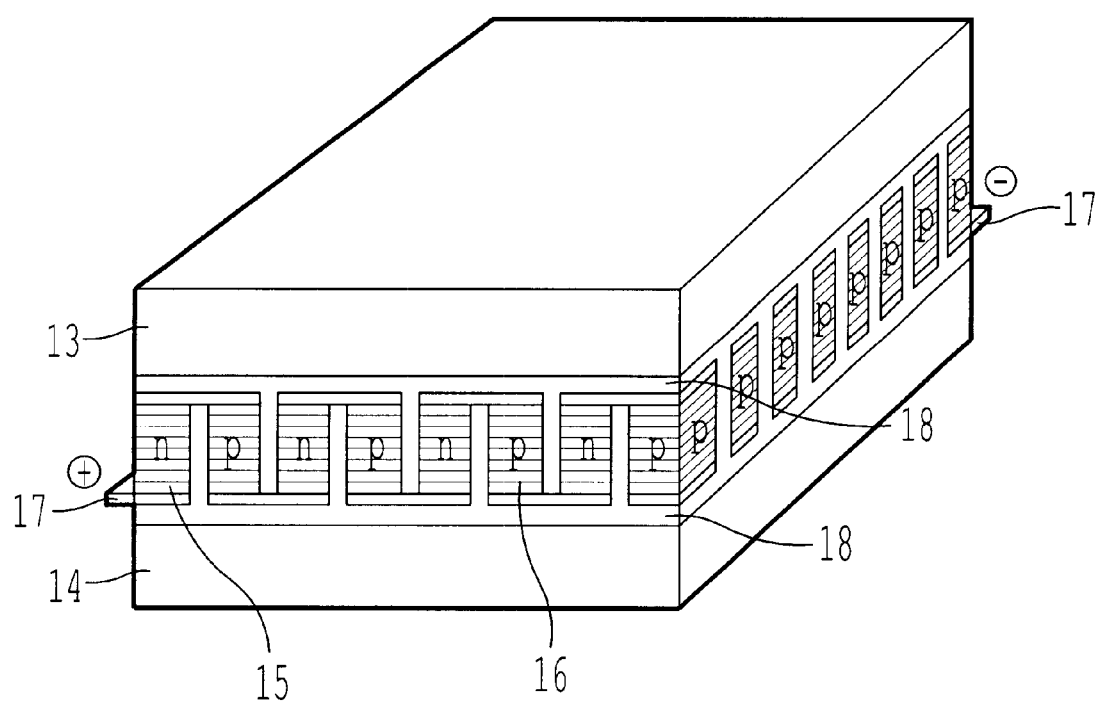
FIG. 2 is schematic of a one-stage thin-film cooler using superlattice thin-film materials.

FIG. 2 shows a schematic of a single-stage thin-film cooler using superlattice thin-film materials which is described in U.S. Pat. No. 6,300,150 B1, herein incorporated by reference. Such high-performance/high-ZT $Bi_2Te_3$-based superlattice structured thin-film thermoelectric materials are discussed elsewhere in R. Venkatasubramanian et al., Appl. Phys. Lett., 75, 1104 (1999), R. Venkatasubramanian, Phys. Rev. B, 61, 3091 (2000), and R. Venkatasubramanian and T. S. Colpitts, in Thermoelectric Materials—New Directions and Approaches, Ed. by T. M. Tritt et. al, MRS Symposia Proceedings No. 478, (MRS, Pittsburgh, 1997), p.73. The contents of these references are incorporated herein by reference. FIG. 2 shows that the single-stage thin-film thermoelectric device includes a heat source plate 13, a heat sink plate 14 operating at an elevated temperature with respect to the heat sink plate, pairs of n-type super-lattice thermoelectric elements 15 and p-type super-lattice thermoelectric elements 16 connected electrically in series and disposed between the heat source and sink plates. As shown in FIG. 2, electrodes 17 are provided to the thin film thermoelectric device to supply electrical current for cooling.

In another preferred embodiment, an electrically insulating film 18 is provided between the thermoelectric elements 15, 16 and the heat plates 13, 14, if the heat plates 13, 14 are electrically conducting.

In a preferred embodiment, the superlattice structured thin-film thermoelectric coolers utilize p-type super-latticed thermoelectric elements with a structure having alternate layers of $Bi_2Te_3$ and $Sb_2Te_3$. Other superlattice materials could be used such as alloys of $Bi_xSb_{2-x}Te_3$ and $Bi_ySb_{3-y}Te_3$, p-type CdSb/ZnSb, and p-type $Si_xGe_{1-x}/Si_yGe_{1-y}$.

In one preferred embodiment, the superlattice structured thin-film thermoelectric coolers utilize n-type super-latticed thermoelectric elements with a structure having alternate layers of $Bi_2Te_{3-x}Se_x$ and $Bi_yTe_{3-y}Te_y$. Other superlattice materials could be used, such as for example n-type $Si_xGe_{1-x}/Si_yGe_{1-y}$.

Figure 3:
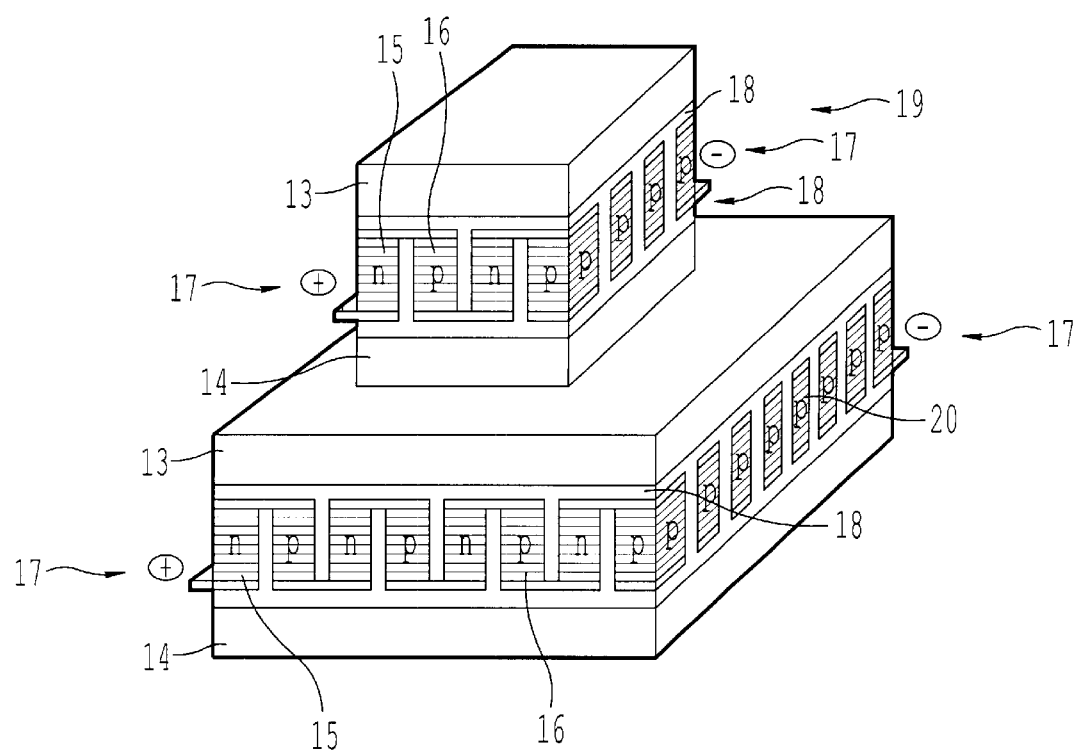
FIG. 3 is a schematic of a two-stage thin-film cooler using superlattice thin-film materials.

In another preferred embodiment, the cascade thermoelectric cooler of the present invention, as shown in FIG. 3, includes a multi-stage thin-film thermoelectric cooler integrated onto a cascaded multi-stage bulk-material-based thermoelectric cooler for achieving lower cryogenic temperatures (30 K–70 K), for achieving higher COP, or for reducing the temperature gradient in each stage of the thin-film cooler. Specifically, FIG. 3 shows a two-stage thin-film cooler using superlattice thin-film materials in which a first stage 19 contains 2 pairs of superlattice thin-film thermoelectric devices and a second stage 20 contains 4 pairs of superlattice thin-film thermoelectric devices. Other embodiments of such a device can involve variations in superlattice spacing, bandgaps, or superlattice components, as is known by those skilled in the art of superlattice engineering, to optimize the performance at various temperature regimes.

More specifically, the thin-film thermoelectric cooler can be fabricated from p-type $Bi_2Te_3/Sb_2Te_3$ and n-type $Bi_2Te_{3-x}Se_x/Bi_2Te_{3-y}Se_y$ superlattice system using MOCVD technologies to form alternating layers of $Bi_2Te_3$ and $Sb_2Te_3$ or $Bi_2Te_{3-x}Se_x$ and $Bi_2Te_{3-y}Se_y$ at superlattice periods ranging from 40 to 70 Å. The integration of electrical and thermal interconnections of p and n type thin-film superlattice materials into a thin-film thermoelectric cooler is shown in FIG. 2 and described in the aforementioned co-pending U.S. patent application Ser. No. 09/147,199.

Integration of the thin-film thermoelectric cooler to the cascade of bulk-material-based thermoelectric elements can be accomplished, for example, by forming the superlattice structure on Si, polycrystalline diamond, SiC, BeO, or other high thermal conductivity substrates and then bonding the substrate with the formed superlattice structure to a bulk-material-based thermoelectric cooler using bonding techniques such as for example discussed in R. Venkatasubramanian et al., Appl. Phys. Lett. 60, 886(1992), herein incorporated by reference, or Qin-Yin Tong et al. Adv. Mat. 17, 1409(1999), herein incorporated by reference.

Accordingly, the cascaded thermoelectric cooler of the present invention offers a number of advantages which can not be realized by thermoelectric coolers composed of only thin-film superlattice thermoelectric devices or bulk-material-based thermoelectric devices.

First, as noted above, a 6-stage Melcor bulk-material-based thermoelectric cooler with a hot side temperature of 300 K can not achieve a cold-side temperature of less than 160 K. Whereas the cascade cooler of the present invention can approach cold-side cryogenic temperatures as low as 30–120 K, for a hot-side temperatures near room temperature (i.e., near 300 K).

Second, a single-stage superlattice thin-film thermoelectric cooler, even with a ZT of 2.65 in the temperature range of 300 K and below, can not achieve a cold-side temperature less than 160 K with a hot-side temperature of 300 K. Thus, cryo-cooling (i.e., 30 K to 120 K) is not possible with a single stage thermoelectric device. However, in the present invention a single-stage superlattice thin-film cooler integrated onto a commercially available cascaded 6-stage bulk cooler can achieve cryogenic temperatures.

Third, the cascade thermoelectric cooler of the present invention avoids a multi-staged (three or four) superlattice thin-film cooler for achieving cryogenic temperatures. Thus, the cascade thermoelectric cooler of the present invention limits use of the potentially expensive superlattice technology to the critical "cryogenic" or near cryogenic stages.

Fourth, utilization of thin-film superlattice materials in the cryogenic or near cryogenic stages of the cascade cooler of the present invention will likely to be more appropriate than relying on thin-film superlattice materials in non-cryogenic stages. The thermal conductivity reduction from phonon scattering at superlattice interfaces [R. Venkatasubramanian and T. S. Colpitts, in Thermoelectric Materials—New Directions and Approaches, Ed. by T. M. Tritt et. al, MRS Symposia Proceedings No. 478, (MRS, Pittsburgh, 1997), p.73] is apparently more effective at temperatures less than 300 K than above 300 K [S. M. Lee, D. G. Cahill, and R. Venkatasubramanian, Appl. Phys. Lett., 70, 2957 (1997)].

Fifth, integration of a single-stage superlattice thin-film cooler onto a cascade of bulk-material-devices, as described above, may reduce the demands placed on thin-film superlattice thermoelectric technology in the area of thermal mismatch and temperature gradient issues. This reduced demand can be inferred from the fact that the bulk cooler maintains a significant portion of the total temperature differential between the cryogenic side and the hot side.

Sixth, it is anticipated that a high ZT thin-film cooler (single or multiple stages) integrated onto a bulk cooler can offer a higher COP as compared to a bulk cooler in cooling systems intended for non-cryogenic temperatures (such as 200 to 250 K). Thus, the invention described, while likely to be most useful for achieving an all-solid state thermoelectric cryogenic cooling, is also useful for non-cryogenic cooling applications.

One application for the cascade thermoelectric coolers of the present invention is in cooling superconducting coils found in electric motors and generators. Large power industrial motors and generators can benefit significantly from the use of superconducting coils. The application of superconducting coils to industrial motors and generators would reduce substantially the rotor ohmic losses (i.e., $I^2R$). The reduction in $I^2R$ loss will more than compensate for the extra power required for refrigeration of the superconducting coils. While some high-temperature superconductors are superconducting at liquid nitrogen temperatures of 77 K, in the presence of magnetic fields (such as in electric motors or generators), the current carrying ability of these liquid nitrogen superconductors is deteriorated. Thus, more expensive liquid helium (at temperatures of 4.2 K) is utilized to keep the superconducting coils at 30 to 50 K, where in the presence of a magnetic field the current carrying capability is not deteriorated.

Figure 4:
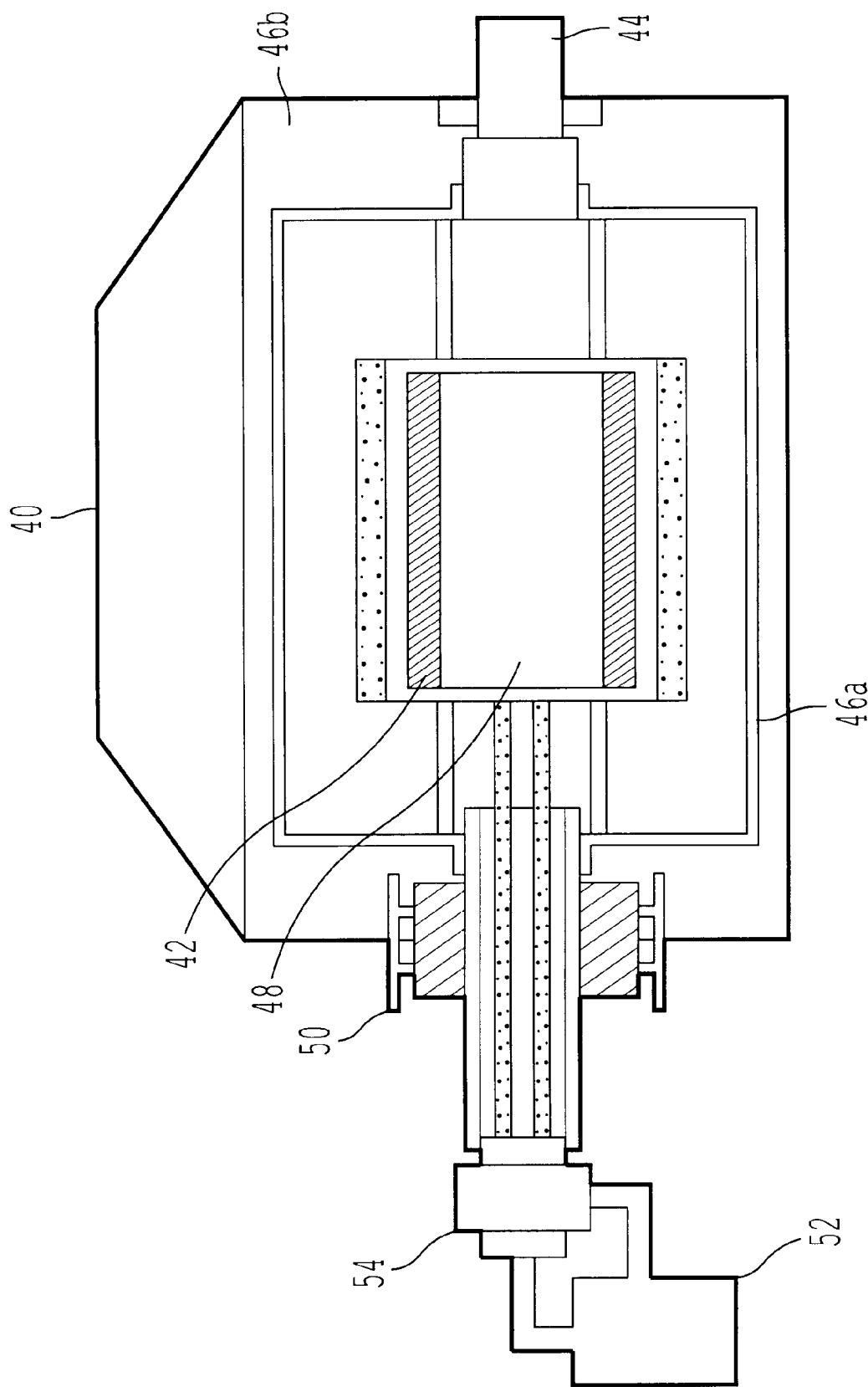
FIG. 4 is a schematic of an electric apparatus utilizing superconducting coils being cooled by a liquid helium refrigerator.

FIG. 4 is a schematic of an electric apparatus 40 (e.g. an electric motor or generator) containing superconducting coils 42. A drive shaft 44 of the apparatus is mounted inside an internal jacket 46a contained in a frame 46b. The internal jacket is typically a vacuum jacket to minimize heat conduction from the outside environment to the superconducting coils. The internal jacket can include adsorbent trapping material to capture moisture from the vacuum of the internal jacket. The superconducting coils 42 are supported by a coil support structure 48. For motor applications, an exciter 50 induces current in the superconducting coils 42 to drive the motor 40. A liquid helium refrigeration system 52 provides liquid helium to cool the coils 42 via a cryogenic transfer coupling 54. The cryogenic transfer coupling 54 is thermally in contact with the superconducting coils 42.

Figure 5:
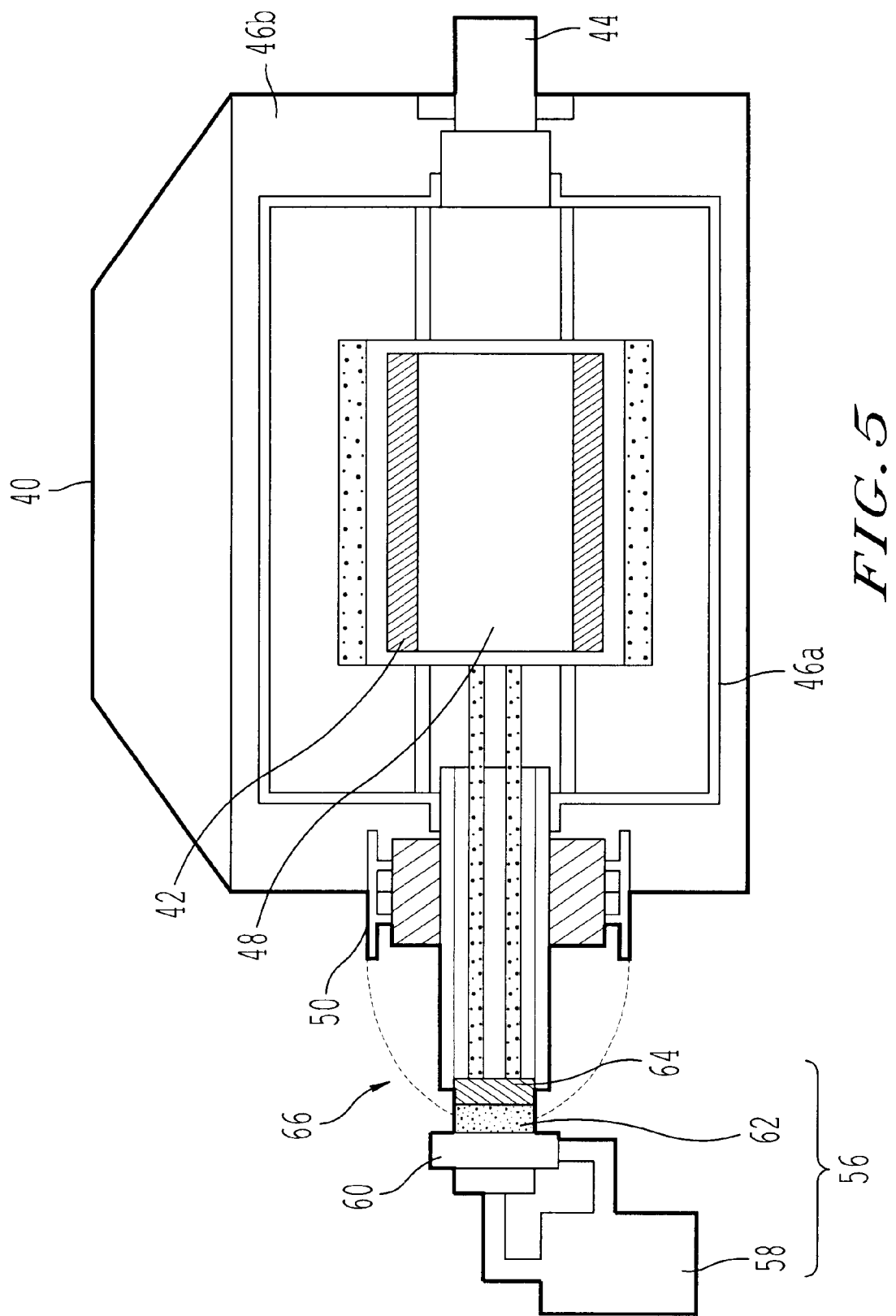
FIG. 5 is a schematic of an electric apparatus, according to the present invention, utilizing superconducting coils being cooled by a liquid-nitrogen assisted thermoelectric cascade cooler.

FIG. 5 is a schematic of an electric apparatus, according to the present invention, utilizing a liquid-nitrogen assisted thermoelectric cascade cooling system 56 to cool the superconducting coils 42. The liquid-nitrogen assisted thermoelectric cooling system 56 depicted in FIG. 5 is an attractive alternative to expensive liquid helium cooling systems. The liquid-nitrogen-assisted thermoelectric cooling system 56 includes a liquid nitrogen refrigeration system 58, a 77 K transfer coupling 60, and a cascade thermoelectric module 62 similar to the multi-staged thermoelectric cooler 1 shown in FIG. 1. In this embodiment, the cascade thermoelectric module 62 utilizes a hot side maintained at 77 K with liquid nitrogen and a cold side at sub-77 K temperatures. Further, the thermoelectric cooling system 56 includes a sub-77 K transfer coupling 64 in thermal connection with the superconducting coils 42. The transfer couplings 60 and 64, according to the present invention, are thermal link devices similar to those disclosed in U.S. Pat. No. 6,164,077, the entire contents of which are incorporated herein by reference. Alternatively, the transfer couplings 60 and 64, according to the present invention, are rotatable gaseous-helium transfer coupling devices similar to those disclosed in U.S. Pat. No. 5,513,498, the entire contents of which are incorporated herein by reference. Further, in FIG. 5, a DC current is delivered (in motor applications) from a brushless exciter 50 which energizes the high-temperature superconducting coils and provides power to the thermoelectric cascade module 62 via a power feed 66.

Figure 6:
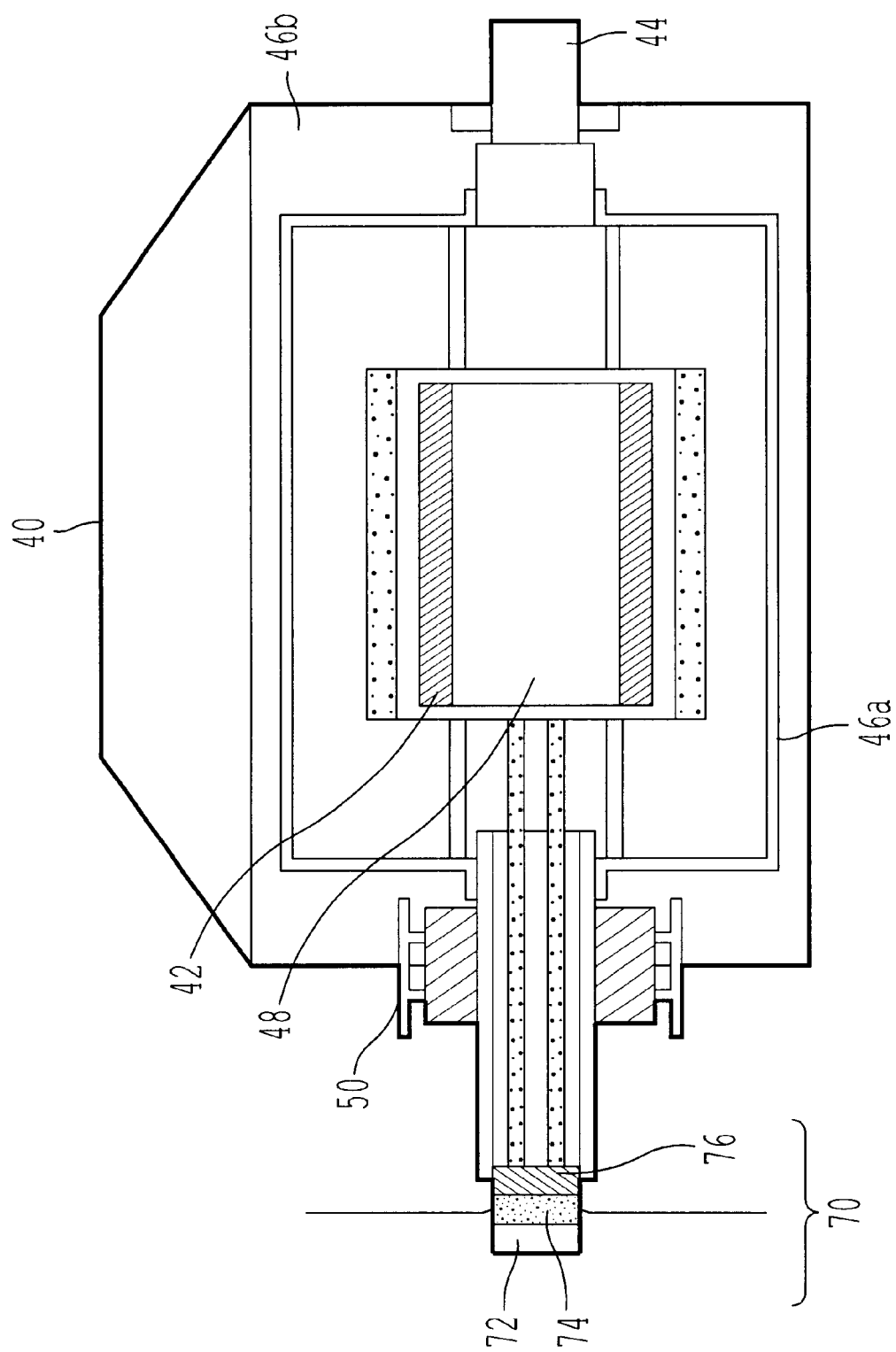
FIG. 6 is a schematic of an electric apparatus, according to the present invention, utilizing superconducting coils being cooled by a thermoelectric cascade cooler coupled between room temperature and cryogenic temperatures of the superconducting coils.

FIG. 6 depicts another embodiment of the present invention in which an all-thermoelectric cooling system 70 is utilized requiring no liquid nitrogen. In the all-thermoelectric cooling system 70, a hot side 72 of a thermoelectric cascade cooler 74 is near room temperature (i.e~300 K), and a cold side 76 of the thermoelectric cascade cooler 74 is maintained at cryogenic temperatures (e.g. 30 K to 50 K). In this embodiment, the cold side 76 is a sub-77 K transfer coupling to the superconducting coils 42. The all-thermoelectric cooling system 70 is more reliable and easier to implement due to the absence of system refrigerants. In FIG. 6, DC power to the cascade cooler 74 comes (in motor applications) from the exciter 50 or from a separate DC power supply.

Figure 7:
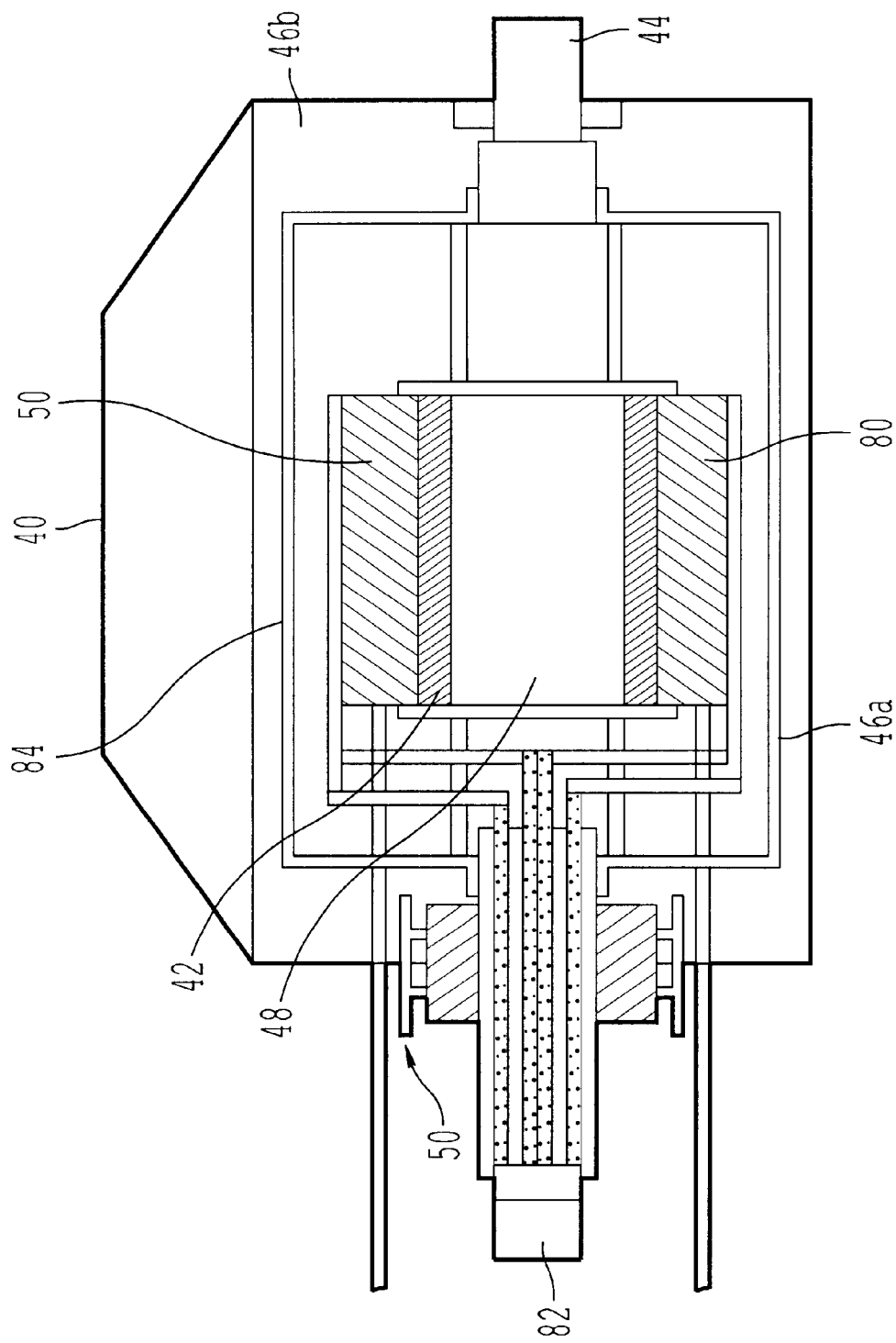
FIG. 7 is a schematic of an electric apparatus, according to the present invention, utilizing superconducting coils being cooled by an integral thermoelectric cascade cooler.

FIG. 7 depicts still another embodiment of the present invention. In this embodiment, a cascade thermoelectric cooler 80 is integrated onto the superconducting coils 42 of the electric motor. Thus, the cascade thermoelectric cooler 80 provides on-spot cooling to the superconducting coils. On spot cooling is expected to be more efficient than transfer cooling permitting applicability to even smaller power industrial motors and generators. In this embodiment, heat is pumped from the cascade thermoelectric cooler 80 to an outside heat-sink 82 via heat transfer fluids pumped in a circulation system 84. Alternatively, enhanced radiative heat transfer as disclosed in the related application U.S. Provisional No. 60/253,743, the entire contents of which have been incorporated by reference, is utilized to couple heat from the cascade thermoelectric cooler 80 to the outside. Power feeds 86 supply power to the thermoelectric cooler 80.

Other configurations of motor or generator design known to those in the art, such as for example motors utilizing superconducting coils on either rotor or stator coil assemblies, could utilize the cascade thermoelectric coolers of the present invention to reduce ohmic losses in the coils and produce a more efficient motor or generator. In those designs, the cascade coolers as in the previous embodiments will be in thermal connection with the superconducting coils and will either cool the coils to cryogenic temperatures with or without liquid nitrogen assisted cooling.

Numerous modifications and variations of the present invention are possible in light of the above teachings. It is therefore to be understood that within the scope of the appended claims, the invention may be practiced otherwise than as specifically described herein.

What is claimed as new and desired to be secured by Letters Patents of the United States is:

1. A cascade thermoelectric cooler comprising:
    a bulk-material-based thermoelectric cooler including plural cascaded cold stages with each successive cascaded cold stage configured to cool to a progressively lower temperature; and
    a super-latticed thermoelectric cooler interfaced to said bulk-material-based thermoelectric cooler.

2. The cooler of claim 1, wherein the bulk-material-based thermoelectric cooler is configured such that said each cold stage of said thermoelectric cooler is in thermal contact with a successive adjacent cold stage and said successive cold stages have a progressively higher number of bulk-material-based thermoelectric elements.

3. The cooler of claim 2, wherein said each successive cascaded cold stage of the bulk-material-based thermoelectric cooler comprises:
    a heat source plate;
    a heat sink plate operating at an elevated temperature with respect to the heat source plate; and
    at least one pair of a n-type bulk-material thermoelectric element and a p-type bulk-material thermoelectric element connected electrically in series and disposed between the heat source and sink plates, each pair of bulk-material thermoelectric elements electrically connected in series.

4. The cooler of claim 3, wherein the p-type bulk-material thermoelectric element comprises p-$Bi_xSb_{2-x}Te_3$.

5. The cooler of claims 3 or 4, wherein the n-type bulk-material thermoelectric element comprises n-$Bi_2Te_{3-x}Se_x$.

6. The cooler of claim 1, wherein the super-latticed thermoelectric cooler comprises a single staged thin-film thermoelectric device.

7. The cooler of claim 6, wherein the single-staged thin-film thermoelectric device comprises:
    a heat source plate;
    a heat sink plate operating at an elevated temperature with respect to the heat source plate; and
    at least one pair of a n-type super-lattice thermoelectric element and a p-type super-lattice thermoelectric element connected electrically in series and disposed between the heat source and sink plates.

8. The cooler of claim 7, wherein the p-type and n-type super-latticed thermoelectric elements comprise materials with ZT greater than 0.5.

9. The cooler of claim 8, wherein the materials with ZT greater than 0.5 are selected from a group of superlattice materials consisting of $Bi_xSb_{2-x}Te_3$, $Bi_2Te_{3-x}Se_3$, CdSb, ZnSb, and $Si_xGe_{1-x}$.

10. The cooler of claim 8, wherein the n-type super-latticed thermoelectric element comprises a structure having alternate layers of $Bi_2Te_{3-x}Se_x$ and $Bi_2Te_{3-y}Se$ with super-lattice periods preferably in the range of 40 to 80 Angstroms.

11. The cooler of claim 8, wherein the p-type super-latticed thermoelectric element comprises a structure having alternate layers of $Bi_xSb_{2-x}Te_3$ and $Bi_ySb_{2-y}Te_3$ with super-lattice periods preferably in the range of 40 to 80 Angstroms.

12. The cooler of claim 8, wherein the n-type super-latticed thermoelectric element comprises a structure having alternate layers of $Si_xGe_{1-x}$ and $Si_yGe_{1-y}$.

13. The cooler of claim 8, wherein the p-type super-latticed thermoelectric element comprises a structure having alternate layers of $Si_xGe_{1-x}$ and $Si_yGe_{1-y}$.

14. The cooler of claim 7, wherein at least one of the heat sink plate and the heat source plate comprises a substrate for growth of the super-latticed thermoelectric elements.

15. The cooler according to claims 14, wherein the substrate is selected from a group of materials consisting of Si, SiC, polycrystalline diamond, and BeO.

16. The cooler according to claim 15, wherein the substrate includes an electrically insulating film configured to provide electrical isolation between the substrate and the at least one pair of super-lattice thermoelectric elements.

17. The cooler of claim 6, wherein the bulk-material-based thermoelectric cooler is configured to cool to between 170 and 200 K and the single staged thin-film thermoelectric device is configured to cool to cryogenic temperatures between 30 and 140 K.

18. The cooler of claim 6, wherein the bulk-material-based thermoelectric cooler is configured to cool to between 200 and 300 K and the single staged thin-film thermoelectric device is configured to cool to non-cryogenic temperatures between 140 and 200 K.

19. The cooler of claim 6, wherein the bulk-material-based thermoelectric cooler is configured to cool to between 300 and 400 K and the single staged thin-film thermoelectric device is configured to cool to non-cryogenic temperatures between 200 and 300 K.

20. The cooler of claim 1, wherein the super-latticed thermoelectric cooler comprises a multi-staged thin-film thermoelectric device.

21. The cooler of claim 20, wherein the multi-staged thin-film thermoelectric device comprises a series of thin-film stages, each said thin-film stage comprising:
   a heat source plate;
   a heat sink plate operating at an elevated temperature with respect to the heat source plate;
   at least one pair of a n-type super-lattice thermoelectric element and a p-type superlattice thermoelectric element connected electrically in series and disposed between the heat source and sink plates.

22. The cooler of claim 21, wherein the p-type and n-type super-latticed thermoelectric elements comprise materials with ZT greater than 0.5.

23. The cooler of claim 22, wherein the materials with ZT greater than 0.5 are selected from a group of superlattice materials consisting of $Bi_xSb_{2-x}Te_3$, $Bi_2Te_{3-x}Se_3$, CdSb, ZnSb, and $Si_xGe_{1-x}$.

24. The cooler of claim 22, wherein the p-type superlatticed thermoelectric element comprises a structure having alternate layers of $Bi_xSb_{2-x}Te_3$ and $Bi_ySb_{2-y}Te_3$.

25. The cooler of claim 22, wherein the n-type super-lattice thermoelectric element comprises a superlattice structure having alternate layers of $Bi_2Te_{3-x}Se_x$ and $Bi_2Te_{3-y}Se_y$.

26. The cooler of claim 22, wherein the n-type super-latticed thermoelectric element comprises a structure having alternate layers of $Si_xGe_{1-x}$ and $Si_yGe_{1-y}$.

27. The cooler of claim 22, wherein the p-type super-latticed thermoelectric element comprises a structure having alternate layers of $Si_xGe_{1-x}$ and $Si_yGe_{1-y}$.

28. The cascade cryogenic thermoelectric cooler of claim 21, wherein at least one of the heat sink plate and the heat source plate comprises a substrate for growth of the super-latticed thermoelectric elements.

29. The cooler according to claims 28, wherein the substrate is selected from a group of materials consisting of Si, SiC, polycrystalline diamond, and BeO.

30. The cooler of claim 29, wherein the substrate includes an electrically insulating film configured to provide electrical isolation between the substrate and the at least one pair of super-lattice thermoelectric elements.

31. The cooler of claim 20, wherein the bulk-material-based thermoelectric cooler is configured to cool to between 170 and 200 K and the multi-staged thin-film thermoelectric device is configured to cool to cryogenic temperatures between 30 and 70 K.

32. The cooler of claim 20, wherein the bulk-material-based thermoelectric cooler is configured to cool to between 200 and 300 K and the multi-staged thin-film thermoelectric device is configured to cool to non-cryogenic temperatures between 140 and 200 K.

33. The cooler of claim 20, wherein the bulk-material-based thermoelectric cooler is configured to cool to between 300 and 400 K and the single staged thin-film thermoelectric device is configured to cool to non-cryogenic temperatures between 200 and 300 K.

34. A method of manufacturing a cascade thermoelectric cooler, comprising:
   attaching a superlattice thermoelectric device to an input heat source plate and an output heat sink plate; and
   bonding the output heat sink plate on the super-latticed thermoelectric device to a bulk-material thermoelectric cooling device having plural cascaded cold stages with each successive cascaded cold stage configured to cool to a progressively lower temperature.

35. The method of 34, wherein the step of attaching comprises the step of:
   bonding the input heat source plate and the output heat sink plate to the super-latticed thermoelectric device.

36. The method of 34, wherein the step of attaching comprises the steps of:
   fabricating a super-latticed thermoelectric device on a substrate configured to be the input heat source plate for the super-latticed thermoelectric device; and
   bonding the output heat sink plate to a side of the super-latticed thermoelectric device opposite said output heat sink plate.

37. The method of 36, wherein the step of fabricating a super-latticed thermoelectric device on a substrate serving as the input heat sink plate comprises a step of:
   fabricating said super-lattice thermoelectric device on a substrate selected from a group of materials consisting of Si, SiC, polycrystalline diamond, and BeO.

38. The method of 37, wherein the step of fabricating said super-lattice thermoelectric device on a substrate selected from a group of materials comprises a step of:
   providing a thin electrically insulating film on said selected substrate.

39. The method of 34, wherein the step of attaching comprises the steps of:

fabricating a super-latticed thermoelectric device on a substrate configured to be the output heat sink plate for the super-latticed thermoelectric device; and bonding the input heat source plate to a side of the super-latticed thermoelectric device opposite said output heat sink plate.

40. The method of 39, wherein the step of fabricating a super-latticed thermoelectric device on a substrate serving as an output heat sink plate comprises a step of:

fabricating said super-lattice thermoelectric device on a substrate selected from a group of materials consisting of Si, SiC, polycrystalline diamond, and BeO.

41. The method of 40, wherein the step of fabricating said super-lattice thermoelectric device on a substrate selected from a group of materials comprises a step of:

providing a thin electrically insulating film on said selected substrate.

42. The method of 34, wherein the step of attaching a superlattice thermoelectric device to an input heat source plate and an output heat sink plate comprises a step of:

attaching said input heat source and output heat sink plates to a super-lattice thermoelectric device having at least one pair of a n-type super-lattice thermoelectric element and a p-type super-lattice thermoelectric element connected electrically in series and disposed between the heat source and sink plates.

43. The method of 34, wherein the step of attaching a superlattice thermoelectric device to an input heat source plate and an output heat sink plate comprises a step of:

attaching said input heat source and output heat sink plates to a super-lattice thermoelectric device having n-type super-latticed thermoelectric elements with alternate layers of $Bi_2Te_{3-x}Se_x$ and $Bi_2Te_{3-y}Se_x$ and p-type super-latticed thermoelectric elements with alternate layers of $Bi_xSb_{2-x}Te_3$ and $Bi_ySb_{2-y}Te_3$.

44. The method of 34, wherein the step of attaching a superlattice thermoelectric device to an input heat source plate and an output heat sink plate device comprises a step of:

attaching said input heat source and output heat sink plates to a super-lattice thermoelectric device having thermoelectric elements with a ZT greater than 0.5.

45. The method of 34, wherein the step of attaching a superlattice thermoelectric device to an input heat source plate and an output heat sink plate comprises a step of:

attaching said input heat source and output heat sink plates to a super-lattice thermoelectric device having super-latticed thermoelectric elements selected from a group of superlattice materials with a ZT greater than 0.5 consisting of $Bi_xSb_{2-x}Te_3$, $Bi_2Te_{3-x}Se_3$, CdSb, ZnSb, and $Si_xGe_{1-y}$.

* * * * *

UNITED STATES PATENT AND TRADEMARK OFFICE
CERTIFICATE OF CORRECTION

PATENT NO.    : 6,505,468 B2    Page 1 of 1
DATED         : January 14, 2003
INVENTOR(S)   : Rama Venkatasubramanian It is certified that error appears in the above-identified patent and that said Letters Patent is hereby corrected as shown below:

<u>Column 1,</u>
Line 8, insert the following:
 -- This invention was made with Government support and under Contracts N00014-94-C-0088 and/or N00014-97-C-0088 awarded by the Office of Naval Research and Contract N00014-97-C-0211 awarded by the Defense Advanced Research Projects Agency. The Government has certain rights in the invention. --

Signed and Sealed this

Sixteenth Day of September, 2003

JAMES E. ROGAN
*Director of the United States Patent and Trademark Office*